United States Patent
Yamada et al.

(10) Patent No.: US 9,263,527 B2
(45) Date of Patent: Feb. 16, 2016

(54) SILICON CARBIDE SEMICONDUCTOR DEVICE AND METHOD OF MANUFACTURING SAME

(71) Applicant: Sumitomo Electric Industries, Ltd., Osaka-shi (JP)

(72) Inventors: Shunsuke Yamada, Osaka (JP); So Tanaka, Osaka (JP); Ryosuke Kubota, Osaka (JP); Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/550,402

(22) Filed: Nov. 21, 2014

(65) Prior Publication Data
US 2015/0171170 A1 Jun. 18, 2015

(30) Foreign Application Priority Data

Dec. 16, 2013 (JP) .................. 2013-258869

(51) Int. Cl.

| | |
|---|---|
| *H01L 29/15* | (2006.01) |
| *H01L 29/16* | (2006.01) |
| *H01L 21/306* | (2006.01) |
| *H01L 21/04* | (2006.01) |
| *H01L 29/66* | (2006.01) |
| *H01L 29/78* | (2006.01) |

(52) U.S. Cl.
CPC .......... *H01L 29/1608* (2013.01); *H01L 21/046* (2013.01); *H01L 21/0475* (2013.01); *H01L 21/0485* (2013.01); *H01L 21/30604* (2013.01); *H01L 29/66068* (2013.01); *H01L 29/78* (2013.01)

(58) Field of Classification Search
CPC ............... H01L 21/046; H01L 21/049; H01L 21/28026; H01L 21/76841; H01L 21/76844; H01L 21/76855; H01L 29/1608; H01L 29/66068; H01L 29/78; H01L 29/782; H01L 21/28158; H01L 29/045; H01L 29/7827
USPC .................... 257/77, 757, 133, 329, 99, 194; 438/268, 586
See application file for complete search history.

(56) References Cited

U.S. PATENT DOCUMENTS

| | | | |
|---|---|---|---|
| 6,455,877 B1 * | 9/2002 | Ogawa et al. | 257/99 |
| 8,653,561 B2 * | 2/2014 | Hashimoto et al. | 257/194 |
| 2003/0107041 A1 * | 6/2003 | Tanimoto et al. | 257/77 |
| 2008/0237867 A1 * | 10/2008 | Wong et al. | 257/757 |

(Continued)

FOREIGN PATENT DOCUMENTS

JP 8-8210 1/1996

*Primary Examiner* — Mohammed Shamsuzzaman
(74) *Attorney, Agent, or Firm* — Venable LLP; Michael A. Sartori; Laura G. Remus

(57) ABSTRACT

A first impurity region is formed by ion implantation of a first impurity into a first main surface of a silicon carbide substrate. A metal layer is formed in contact with the first impurity region. By annealing the silicon carbide substrate and the metal layer, an electrode is formed. The metal layer is formed such that a concentration of a first impurity at a boundary portion between the metal layer and the first impurity region becomes less than a maximum value of a concentration of the first impurity in the first impurity region. The electrode is formed such that a concentration of the first impurity at a boundary portion between the electrode and the first impurity region becomes not less than 80% of a maximum value of a concentration of the first impurity in the first impurity region in a normal direction.

4 Claims, 11 Drawing Sheets

(56) References Cited

U.S. PATENT DOCUMENTS

| | | | |
|---|---|---|---|
| 2010/0327313 A1* | 12/2010 | Nakamura | 257/133 |
| 2011/0031507 A1* | 2/2011 | Tamaso | 257/77 |
| 2011/0175111 A1* | 7/2011 | Harada et al. | 257/77 |
| 2011/0193101 A1* | 8/2011 | Yanase et al. | 257/77 |
| 2011/0207275 A1* | 8/2011 | Tanaka et al. | 438/268 |
| 2012/0012861 A1* | 1/2012 | Nakano et al. | 257/77 |
| 2012/0037922 A1* | 2/2012 | Kono et al. | 257/77 |
| 2012/0097980 A1* | 4/2012 | Masuda et al. | 257/77 |
| 2012/0153303 A1* | 6/2012 | Uchida | 257/77 |
| 2012/0184094 A1* | 7/2012 | Yamada | 438/586 |
| 2012/0217513 A1* | 8/2012 | Tega et al. | 257/77 |
| 2013/0020586 A1* | 1/2013 | Miura et al. | 257/77 |
| 2013/0020587 A1* | 1/2013 | Hino et al. | 257/77 |
| 2013/0062622 A1* | 3/2013 | Tsuchiya | 257/77 |
| 2013/0082285 A1* | 4/2013 | Kudou et al. | 257/77 |
| 2013/0099253 A1* | 4/2013 | Ohtsuka et al. | 257/77 |
| 2013/0292702 A1* | 11/2013 | Horii | 257/77 |
| 2013/0292703 A1* | 11/2013 | Horii et al. | 257/77 |
| 2013/0299849 A1* | 11/2013 | Tega et al. | 257/77 |
| 2014/0103365 A1* | 4/2014 | Fujimoto et al. | 257/77 |
| 2014/0346528 A1* | 11/2014 | Hisada et al. | 257/77 |
| 2015/0001549 A1* | 1/2015 | Miura et al. | 257/76 |
| 2015/0001553 A1* | 1/2015 | Kudou et al. | 257/77 |
| 2015/0108564 A1* | 4/2015 | Miura et al. | 257/329 |

\* cited by examiner

SILICON CARBIDE SEMICONDUCTOR DEVICE AND METHOD OF MANUFACTURING SAME

BACKGROUND OF THE INVENTION

1. Field of the Invention

The present invention relates to a silicon carbide semiconductor device and a method of manufacturing the silicon carbide semiconductor device, in particular, a silicon carbide semiconductor device including a silicon carbide substrate having an impurity region formed therein and a method of manufacturing such a silicon carbide semiconductor device.

2. Description of the Background Art

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, a reduced on-resistance, and the like. Further, the semiconductor device thus adopting silicon carbide as its material has characteristics less deteriorated even under a high temperature environment than those of a semiconductor device adopting silicon as its material, advantageously.

For example, Japanese Patent Laying-Open No. 8-8210 describes a method of manufacturing a silicon carbide semiconductor element including an electrode making ohmic contact with a silicon carbide substrate. According to the method of manufacturing the silicon carbide semiconductor element, ions are implanted into a surface of the silicon carbide substrate, and then the surface layer is thermally oxidized from the surface up to a depth at which the concentration of the ion species thus implanted has a peak value. An oxide layer, which is formed by the thermal oxidation, is removed and then a metal electrode is formed on the exposed surface. In this way, an electrode having a low contact resistance can be allegedly formed on the surface of the silicon carbide substrate.

SUMMARY OF THE INVENTION

When the oxide layer formed by the thermal oxidation is removed after thermally oxidizing the surface layer of the silicon carbide substrate up to the depth at which the concentration of the ion species has a peak value, a region having the highest impurity concentration in the impurity region is exposed at the surface of the silicon carbide substrate. By forming the electrode on the surface of the silicon carbide substrate, a contact resistance between the electrode and the silicon carbide substrate is reduced to some extent. However, with the above-described method, the contact resistance between the electrode and the silicon carbide substrate cannot be sufficiently reduced.

The present invention has been made to solve the above-described problem, and has an object to provide a silicon carbide semiconductor device and a method of manufacturing the silicon carbide semiconductor device, by each of which a contact resistance between a silicon carbide substrate and an electrode can be reduced effectively.

A method of manufacturing a silicon carbide semiconductor device according to the present invention includes the following steps. A silicon carbide substrate is prepared which has a first main surface and a second main surface opposite to the first main surface. A first impurity region having a first conductivity type is formed through ion implantation of a first impurity into the first main surface of the silicon carbide substrate. A metal layer is formed in contact with the first impurity region. An electrode is formed by annealing the silicon carbide substrate and the metal layer. In the step of forming the metal layer, the metal layer is formed such that a concentration of the first impurity at a boundary portion between the metal layer and the first impurity region becomes less than a maximum value of a concentration of the first impurity in the first impurity region in a normal direction of the first main surface. The electrode is formed such that the concentration of the first impurity at a boundary portion between the electrode and the first impurity region becomes not less than 80% of the maximum value of the concentration of the first impurity in the first impurity region in the normal direction after the step of forming the electrode.

A silicon carbide semiconductor device according to the present invention includes a silicon carbide substrate, and an electrode. The silicon carbide substrate has a first main surface and a second main surface opposite to the first main surface. The first main surface of the silicon carbide substrate is provided with a recess including a side portion continuous to the first main surface and a bottom portion continuous to the side portion. The silicon carbide substrate includes a first impurity region that constitutes at least a portion of the bottom portion of the recess, that has a first conductivity type, and that has a first impurity. The electrode is in contact with the first impurity region at the bottom portion of the recess. A concentration of the first impurity at a boundary portion between the electrode and the first impurity region is not less than 80% of a maximum value of a concentration of the first impurity in the first impurity region along a straight line that passes through an intermediate point between a first contact point and a second contact point and that is parallel to a normal line of the first main surface, the first contact point being a contact point between an outer circumferential end portion of the first impurity region and the first main surface and the second contact point being a contact point between the side portion of the recess and the first main surface when viewed in a cross section.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
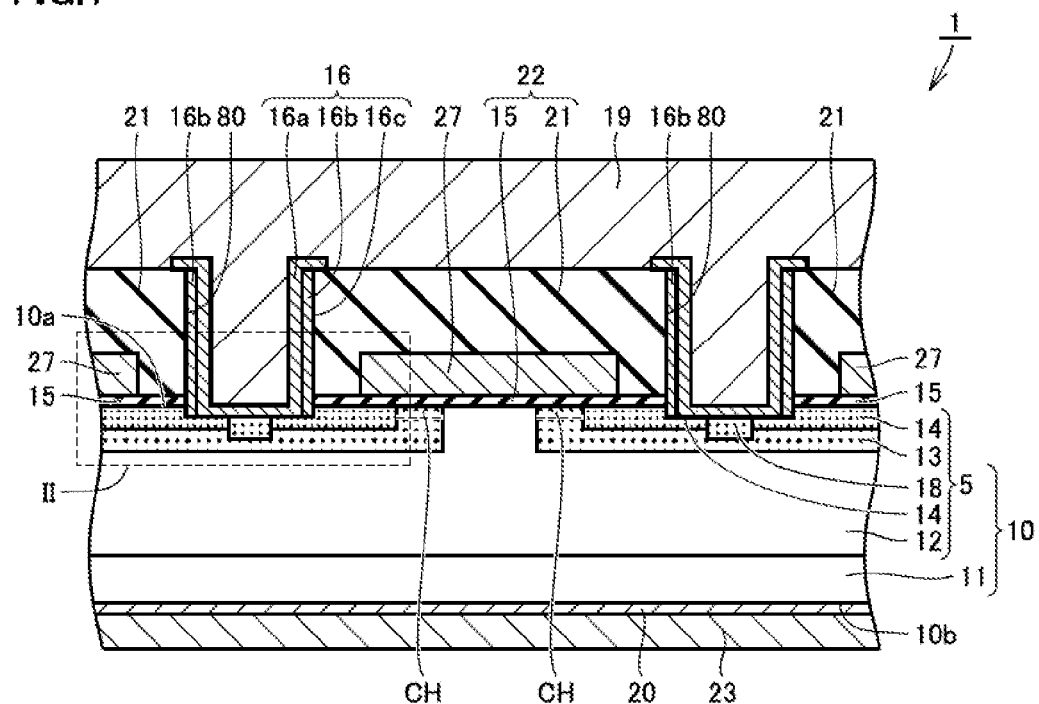
FIG. 1 is a schematic cross sectional view for schematically illustrating a structure of a silicon carbide semiconductor device according to one embodiment of the present invention.

Description of Embodiments of Invention of Present Application

The following describes an embodiment of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

As a result of diligent study as to a method of reducing a contact resistance between a silicon carbide substrate and an electrode, the inventors have obtained the following knowledge and found the present invention.

According to the method described in Japanese Patent Laying-Open No. 8-8210, the region having a maximum value of impurity concentration in the impurity region is exposed at the surface of the silicon carbide substrate, then the metal layer is on the surface, the metal layer is then annealed, thereby forming the electrode. When the metal layer is annealed, the metal layer reacts with silicon carbide, thereby forming an alloy layer. The alloy layer is formed to incorporate a portion of the surface of the silicon carbide substrate. Hence, the bottom portion of the alloy layer after the annealing (in other words, the boundary portion between the electrode and the impurity region) is not located at the surface of the silicon carbide substrate, but is located at the backside surface side relative to the surface of the silicon carbide substrate. Thus, when the region having a maximum value of impurity concentration in the impurity region is exposed at the surface of the silicon carbide substrate and the metal layer is then formed on the surface and annealed, the impurity concentration at the bottom portion of the alloy layer becomes less than the maximum value of the impurity concentration in the impurity region.

As a result of diligent study, the inventors have found that a contact resistance between a silicon carbide substrate and an electrode can be reduced effectively by forming the electrode such that a region having a large impurity concentration in an impurity region is located at a boundary portion between the electrode and the impurity region after the annealing, instead of exposing the region having a large impurity concentration in the impurity region at the surface of the silicon carbide substrate (i.e., boundary portion between the metal layer and the impurity region before the annealing).

(1) A method of manufacturing a silicon carbide semiconductor device 1 according to an embodiment includes the following steps. A silicon carbide substrate 10 is prepared which has a first main surface 10a and a second main surface 10b opposite to first main surface 10a. A first impurity region 14 having a first conductivity type is formed through ion implantation of a first impurity into first main surface 10a of silicon carbide substrate 10. A metal layer 16a is formed in contact with first impurity region 14. An electrode 16 is formed by annealing silicon carbide substrate 10 and metal layer 16a. In the step of forming metal layer 16a, metal layer 16a is formed such that a concentration of the first impurity at a boundary portion 10c between metal layer 16a and first impurity region 14 becomes less than a maximum value of a concentration of the first impurity in first impurity region 14 in a normal direction of first main surface 10a. Electrode 16 is formed such that the concentration of the first impurity at a boundary portion 86b2 between electrode 16 and first impurity region 14 becomes not less than 80% of the maximum value of the concentration of the first impurity in first impurity region 14 in the normal direction after the step of forming electrode 16.

According to the method of manufacturing silicon carbide semiconductor device 1 according to (1), electrode 16 is formed such that the concentration of the first impurity at boundary portion 8b2 between electrode 16 and first impurity region 14 becomes not less than 80% of the maximum value of the concentration of the first impurity in first impurity region 14 in the normal direction. Accordingly, the concentration of the first impurity at boundary portion 8b2 between electrode 16 and first impurity region 14 becomes high, thereby effectively reducing a contact resistance between first impurity region 14 included in silicon carbide substrate 10 and electrode 16.

(2) The method of manufacturing silicon carbide semiconductor device 1 according to (1) may further include the step of forming a recess 8 by etching first impurity region 14 of silicon carbide substrate 10 after the step of forming first impurity region 14 and before the step of forming metal layer 16a. In the step of forming metal layer 16a, metal layer 16a is formed in contact with first impurity region 14 at a bottom portion 8b of recess 8. Accordingly, a contact area between first impurity region 14 and metal layer 16a becomes large, thereby more effectively reducing the contact resistance between first impurity region 14 included in silicon carbide substrate 10 and electrode 16. Moreover, by etching first impurity region 14, the region having a high concentration of the first impurity can be effectively exposed at the surface of first impurity region 14.

(3) The method of manufacturing silicon carbide semiconductor device 1 according to (1) or (2) may further include the steps of thermally oxidizing first main surface 10a of silicon carbide substrate 10 after the step of forming first impurity region 14 and before the step of forming metal layer 16a, and removing an oxide film 24 formed by the step of thermally oxidizing first main surface 10a. In this way, when the position having the maximum value of the concentration of the first impurity in first impurity region 14 is located at a position distant away from first main surface 10a of silicon carbide substrate 10, the position having the maximum value of the concentration of the first impurity can be located near first main surface 10a of silicon carbide substrate 10.

(4) The method of manufacturing silicon carbide semiconductor device 1 according to any one of (1) to (3) may further include the step of forming a second impurity region 18 having a second conductivity type and in contact with first impurity region 14 by ion implantation of a second impurity into first main surface 10a of silicon carbide substrate 10 before the step of forming metal layer 16a. In the step of forming metal layer 16a, metal layer 16a is formed in contact with each of first impurity region 14 and second impurity region 18. Electrode 16 is formed such that a concentration of the second impurity at a boundary portion 8b3 between electrode 16 and second impurity region 18 becomes not less than 80% of a maximum value of a concentration of the second impurity in second impurity region 18 in the normal direction after the step of forming electrode 16. Accordingly, the concentration of the second impurity in boundary portion 8b3 between electrode 16 and second impurity region 18 becomes high, thereby effectively reducing the contact resistance between second impurity region 18 included in silicon carbide substrate 10 and electrode 16.

(5) The method of manufacturing silicon carbide semiconductor device 1 according to any one of (1) to (4) may further include, after the step of forming first impurity region 14 and before the step of forming metal layer 16a, the steps of: forming an insulating film 22 having an opening 80 which faces first main surface 10a of silicon carbide substrate 10 and through which at least a portion of first impurity region 14 is exposed; and forming a buffer layer 16b that is in contact with each of insulating film 22 and first impurity region 14 in opening 80 and that contains no aluminum; and removing buffer layer 16b from above first impurity region 14 while buffer layer 16b in contact with insulating film 22 in opening 80 remains. In the step of forming metal layer 16a, metal layer 16a is formed in contact with each of first impurity region 14 and buffer layer 16b in opening 80, metal layer 16a containing aluminum. In the step of forming electrode 16, electrode 16 is formed by annealing silicon carbide substrate 10, metal layer 16a, and buffer layer 16b. Here, buffer layer 16b not containing aluminum is intended to mean a buffer layer 16b having no aluminum added intentionally, and may be a buffer layer 16b having aluminum unintentionally mixed as an impurity, for example. Since buffer layer 16b is in contact with insulating film 22, aluminum contained in metal layer 16a can be suppressed from being spread in insulating film 22. Accordingly, an insulating property of silicon carbide semiconductor device 1 can be suppressed from being decreased.

(6) In the method of manufacturing silicon carbide semiconductor device 1 according to (5), buffer layer 16b may contain titanium and nitrogen. In this way, adhesion between electrode 16 and insulating film 22 can be improved.

(7) A silicon carbide semiconductor device 1 according to an embodiment includes a silicon carbide substrate 10 and an electrode 16. Silicon carbide substrate 10 has a first main surface 10a and a second main surface 10b opposite to first main surface 10a. First main surface 10a of silicon carbide substrate 10 is provided with a recess 8 including a side portion 8a continuous to first main surface 10a and a bottom portion 8b continuous to side portion 8a. Silicon carbide substrate 10 includes a first impurity region 14 that constitutes at least a portion of bottom portion 8b of recess 8, that has a first conductivity type, and that has a first impurity. Electrode 16 is in contact with first impurity region 14 at bottom portion 8b of recess 8. A concentration of the first impurity at a boundary portion 8b2 between electrode 16 and first impurity region 14 is not less than 80% of a maximum value of a concentration of the first impurity in first impurity region 14 along a straight line that passes through an intermediate point 14c between a first contact point 14b and a second contact point 16d and that is parallel to a normal line of first main surface 10a, first contact point 14b being a contact point between an outer circumferential end portion 14a of first impurity region 14 and first main surface 10a and second contact point 16d being a contact point between side portion 8a of recess 8 and first main surface 10a when viewed in a cross section.

According to silicon carbide semiconductor device 1 according to (7), the concentration of the first impurity at boundary portion 8b2 between electrode 16 and first impurity region 14 is not less than 80% of the maximum value of the concentration of the first impurity in first impurity region 14 along the straight line that passes through intermediate point 14c between first contact point 14b and second contact point 16d and that is parallel to the normal line of first main surface 10a, first contact point 14b being the contact point between outer circumferential end portion 14a of first impurity region 14 and first main surface 10a and second contact point 16d being the contact point between side portion 8a of recess 8 and first main surface 10a when viewed in the cross section. Accordingly, the concentration of the first impurity at boundary portion 8b2 between electrode 16 and first impurity region 14 becomes high, thereby effectively reducing a contact resistance between first impurity region 14 included in silicon carbide substrate 10 and electrode 16.

(8) In silicon carbide semiconductor device 1 according to (7), silicon carbide substrate 10 may include a second impurity region 18 that is in contact with each of first impurity region 14 and electrode 16, that has a second conductivity type, and that has a second impurity. A concentration of the second impurity at a boundary portion 8b3 between electrode 16 and second impurity region 18 is not less than 80% of a maximum value of a concentration of the second impurity in second impurity region 18 in a normal direction of the first main surface. Accordingly, the concentration of the second impurity in boundary portion 8b3 between electrode 16 and second impurity region 18 becomes high, thereby effectively reducing the contact resistance between second impurity region 18 included in silicon carbide substrate 10 and electrode 16.

(9) Silicon carbide semiconductor device 1 according to (7) or (8) may further include an interlayer insulating film 21 provided at a position facing first main surface 10a of silicon carbide substrate 10. Electrode 16 includes a buffer layer 16b that is in contact with interlayer insulating film 21 and a metal layer 16a that is separated from interlayer insulating film 21 by buffer layer 16b and that is in contact with first impurity region 14 at bottom portion 8b of recess 8. Buffer layer 16b is made of a material not containing aluminum and metal layer 16a is made of a material containing aluminum. Since buffer layer 16b is in contact with insulating film 22, aluminum contained in metal layer 16a can be suppressed from being spread in insulating film 22. Accordingly, an insulating property of silicon carbide semiconductor device 1 can be suppressed from being decreased.

(10) In silicon carbide semiconductor device 1 according to (9), buffer layer 16b may contain titanium and nitrogen. In this way, adhesion between electrode 16 and insulating film 22 can be improved.

Details of Embodiments of Invention of Present Application

First, the following describes a configuration of a MOSFET (Metal Oxide Semiconductor Field Effect Transistor) serving as a silicon carbide semiconductor device according to one embodiment of the present invention.

With reference to FIG. 1, a MOSFET 1 according to the present embodiment mainly includes a silicon carbide substrate 10, gate electrodes 27, gate oxide films 15, interlayer insulating films 21, source electrodes 16, a front surface protecting electrode 19, a drain electrode 20, and a backside surface protecting electrode 23. Silicon carbide substrate 10 has a first main surface 10a and a second main surface 10b opposite to first main surface 10a, and mainly includes a silicon carbide single crystal substrate 11 and a silicon carbide epitaxial layer 5 provided on silicon carbide single crystal substrate 11.

Silicon carbide single crystal substrate 11 is made of a hexagonal silicon carbide single crystal of polytype 4H, for example. First main surface 10a of silicon carbide substrate 10 has a maximum diameter of for example, more than 100 mm, preferably, 150 mm or more. First main surface 10a of silicon carbide substrate 10 is a surface corresponding to a {0001} plane or a surface off by 8° or less relative to the {0001} plane, for example. Specifically, first main surface 10a is a surface corresponding to a (0001) plane or a surface off by about 8° or less relative to the (0001) plane, whereas second main surface 10b is a surface corresponding to a (000-1) plane or a surface off by about 8° or less relative to the (000-1) plane, for example. Silicon carbide substrate 10 has a thickness of, for example, not more than 700 µm, preferably, not more than 500 µm.

Silicon carbide epitaxial layer 5 includes a drift region 12, body regions 13, source regions 14, and contact regions 18. Drift region 12 is an n type (first conductivity type) region containing a donor impurity such as nitrogen. The donor impurity in drift region 12 has a concentration of, for example, about $5.0 \times 10^{15}$ cm$^{-3}$. Each of body regions 13 is a region having a p type (second conductivity type). Body region 13 contains an acceptor impurity such as Al (aluminum) or B (boron), for example. The acceptor impurity in body region 13 has a concentration of, for example, about $1 \times 10^{17}$ cm$^{-3}$.

Each of source regions 14 (first impurity region) is an n type region containing a donor impurity such as phosphorus. Source region 14 is formed inside body region 13 such that source region 14 is surrounded by body region 13. The donor impurity in source region 14 has a concentration higher than the concentration of the donor impurity in drift region 12. The donor impurity of source region 14 has a concentration of, for example, $1 \times 10^{19}$ cm$^{-3}$. Source region 14 is separated from drift region 12 by body region 13.

Each of contact regions 18 (second impurity region) is a p type region. Contact region 18 is provided to be surrounded by source region 14, and is formed in contact with body region 13. Contact region 18 contains an impurity, such as Al or B, at a concentration higher than that of the impurity contained in body region 13. The impurity in contact region 18, such as Al or B, has a concentration of $1 \times 10^{20}$ cm$^{-3}$, for example.

Each of gate oxide films 15 is formed in contact with first main surface 10a of silicon carbide substrate 10 so as to extend from the upper surface of one source region 14 to the upper surface of the other source region 14. Gate oxide film 15 is in contact with source region 14, body region 13, and drift region 12 at first main surface 10a of silicon carbide substrate 10. Gate oxide film 15 is made of silicon dioxide, for example. Gate oxide film 15 has a thickness of about not less than 40 nm and not more than 60 nm, for example.

Each of gate electrodes 27 is disposed in contact with gate oxide film 15 so as to extend from a location over one source region 14 to a location over the other source region 14. Gate electrode 27 is provided on gate oxide film 15 with gate oxide film 15 interposed between gate electrode 27 and silicon carbide substrate 10. Gate electrode 27 is formed over source region 14, body region 13, and drift region 12 with gate oxide film 15 interposed therebetween. Gate electrode 27 is made of polysilicon having an impurity doped therein or a conductor such as Al, for example.

Source electrode 16 is disposed in contact with first main surface 10a of silicon carbide substrate 10 so as to extend from a location over source region 14 to a location over contact region 18 in a direction of getting away from gate oxide film 15. Source electrode 16 is in contact with each of source region 14 and contact region 18 at first main surface 10a of silicon carbide substrate 10. Details of the structure of source electrode 16 will be described later.

Interlayer insulating film 21 is provided at a position facing first main surface 10a of silicon carbide substrate 10. Specifically, interlayer insulating film 21 is provided in contact with each of gate electrode 27 and gate oxide film 15 so as to cover gate electrode 27. Interlayer insulating film 21 electrically insulates between gate electrode 27 and source electrode 16. Front surface protecting electrode 19 is provided to cover interlayer insulating film 21 and make contact with source electrode 16. Front surface protecting electrode 19 is electrically connected to source region 14 via source electrode 16.

Drain electrode 20 is provided in contact with second main surface 10b of silicon carbide substrate 10. Drain electrode 20 is made of a material capable of ohmic contact with silicon carbide single crystal substrate 11, such as NiSi (nickel silicide). Accordingly, drain electrode 20 is electrically connected to silicon carbide single crystal substrate 11. Backside surface protecting electrode 23 is formed in contact with the main surface of drain electrode 20 opposite to silicon carbide single crystal substrate 11. Backside surface protecting electrode 23 is made of a material containing Al, for example.

Figure 2:
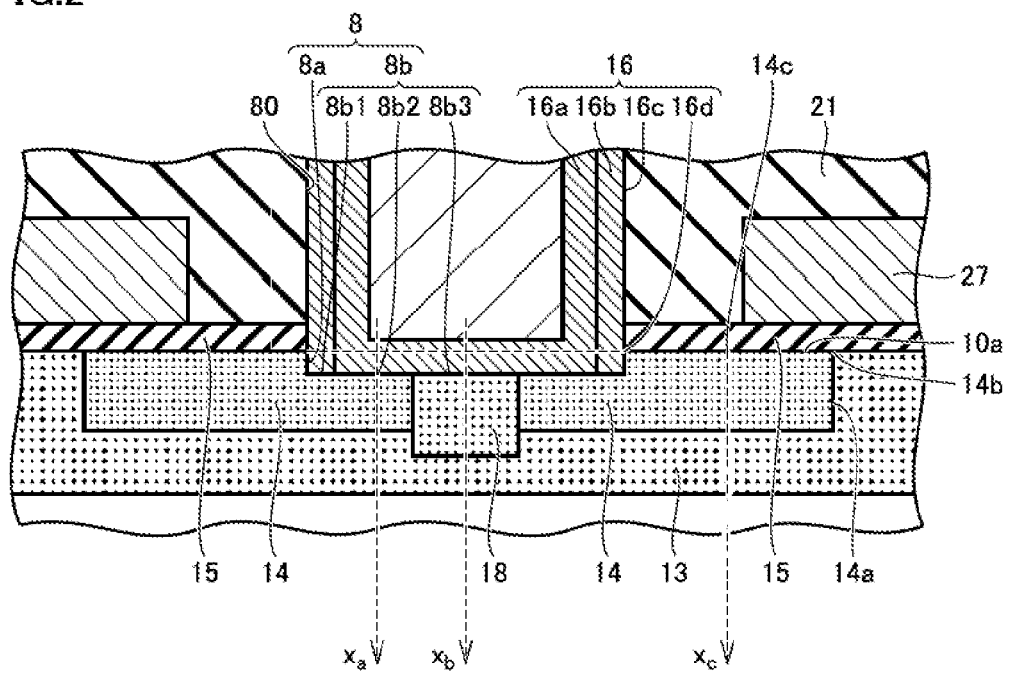
FIG. 2 is an enlarged view of a region II in FIG. 1.

With reference to FIG. 2, the following describes a structure in the vicinity of the bottom surface of source electrode 16 in detail. As shown in FIG. 2, in first main surface 10a of silicon carbide substrate 10, there is formed a recess 8 including side portions 8a continuous to first main surface 10a and a bottom portion 8b continuous to side portions 8a. Preferably, source region 14 constitutes at least a portion of bottom portion 8b of recess 8. In the present embodiment, source region 14 constitutes each of side portions 8a and bottom portion 8b of recess 8. Source electrode 16 is in contact with source region 14 at each of side portion 8a and bottom portion 8b of recess 8, and is contact with contact region 18 at bottom portion 8b of recess 8.

Source electrode 16 includes a metal layer 16a and a buffer layer 16b, for example. Metal layer 16a is in contact with each of source region 14 and contact region 18 at bottom portion 8b of recess 8. Metal layer 16a is made of a material containing, for example, aluminum, and is preferably made of TiAlSi. Metal layer 16a makes ohmic contact with source region 14. Preferably, metal layer 16a makes ohmic contact with each of source region 14 and contact region 18. Metal layer 16a includes an alloy portion (not shown) in contact with a boundary portion 8b2 between metal layer 16a and source region 14.

Buffer layer 16b is in contact with source region 14 at each of side portion 8a and bottom portion 8b of recess 8. Buffer layer 16b is disposed in opening 80 to extend along an inner wall surface that forms an opening 80. Buffer layer 16b is in contact with each of gate oxide film 15 and interlayer insulating film 21 at the inner wall surface of opening 80. Buffer layer 16b is made of a material not containing aluminum, for example. Preferably, buffer layer 16b contains titanium and nitrogen. Buffer layer 16b is TiN, for example.

Metal layer 16a is separated by buffer layer 16b from each of interlayer insulating film 21 and gate oxide film 15. Metal layer 16a is disposed in opening 80 at an inner side relative to buffer layer 16b. The inner wall surface of opening 80 is formed in a direction in which side portion 8a of recess 8 extends. Buffer layer 16b has a portion disposed in recess 8 and in contact with source region 14 at each of side portion 8a and bottom portion 8b of recess 8. Metal layer 16a has a portion disposed in recess 8. Metal layer 16a is disposed in recess 8 at an inner side relative to buffer layer 16b. Metal layer 11a is in contact with each of source region 14 and contact region 18 at bottom portion 8b of recess 8. Front surface protecting electrode 19 is in contact with metal layer 16a at a region surrounded by the inner wall surface that forms opening 80. Bottom portion 8b of recess 8 includes: a boundary portion 8b1 between buffer layer 16b and source region 14; a boundary portion 8b2 between metal layer 16a and source region 14; and a boundary portion 8b3 between metal layer 16a and contact region 18.

Figure 3:
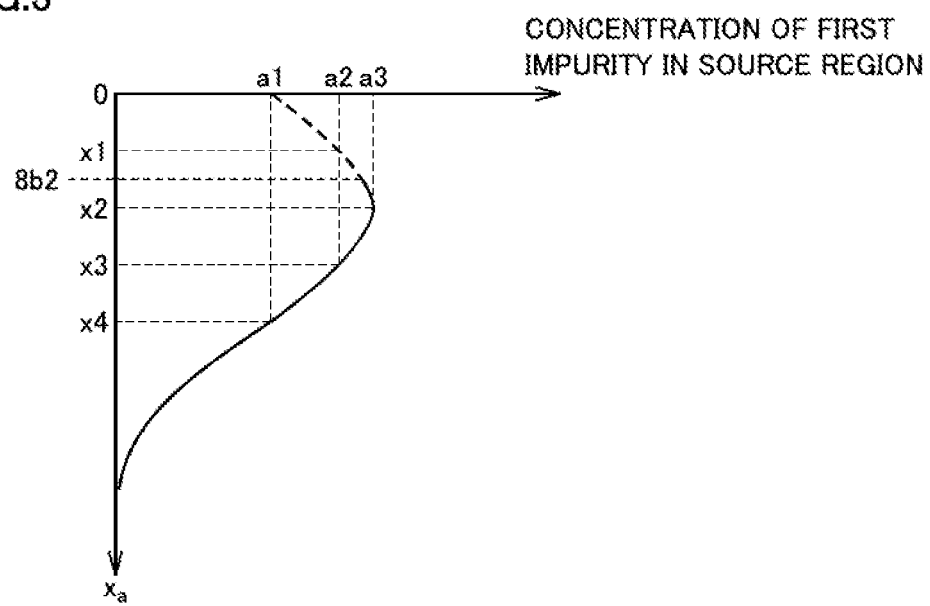
FIG. 3 shows a concentration distribution of a first impurity in a source region in a direction $X_a$ in FIG. 2.
Figure 5:
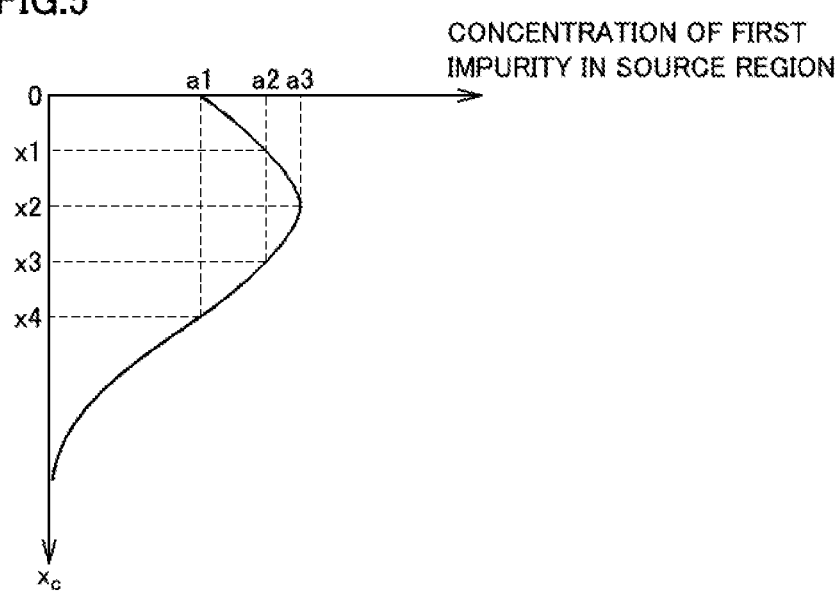
FIG. 5 shows a concentration distribution of the first impurity in the source region in a direction $X_c$ in FIG. 2.

With reference to FIG. 3 and FIG. 5, the following describes a concentration distribution of the first impurity in source region 14 in a normal direction of first main surface 10a of silicon carbide substrate 10. The first impurity contained in source region 14 is phosphorus, for example. As shown in FIG. 2, a direction $X_a$ in FIG. 3 is a direction of extending longitudinally across source region 14 in the normal direction of boundary portion 8b2 between source electrode 16 and source region 14. A position 0 in the $X_a$ direction is a position corresponding to first main surface 10a of silicon carbide substrate 10. Moreover, as shown in FIG. 2, a direction $X_c$ in FIG. 5 is a direction of a straight line that passes through an intermediate point 14c between a first contact point 14b and a second contact point 16d and that is parallel to the normal line of first main surface 10a of silicon carbide substrate 10, first contact point 14b being a contact point between outer circumferential end portion 14a of source region 14 and first main surface 10a and second contact point 16d being a contact point between side portion 8a of recess 8 and first main surface 10a of silicon carbide substrate 10 when viewed in a cross section (field of view in a direction parallel to first main surface 10a of silicon carbide substrate 10).

Each of position 0 in the $X_a$ direction and position 0 in the $X_c$ direction is a position corresponding to first main surface 10a of silicon carbide substrate 10. A broken line in FIG. 3 represents a concentration of the first impurity in metal layer 16a. The concentration of the first impurity in metal layer 16a of source electrode 16 at position 0 in the $X_a$ direction is represented as an impurity concentration a1. As shown in FIG. 3 and FIG. 5, when getting away from first main surface 10a of silicon carbide substrate 10 toward the second main surface 10b side, the concentration of the first impurity in source region 14 is increased and a maximum impurity concentration a3 is obtained at a position x2 in source region 14. A distance from position 0 to position x2 in each of the $X_a$ direction and the $X_c$ direction is, for example, about not less than 0.01 µm and not more than 1.0 µm. When getting further away toward the second main surface 10b side, the concentration of the first impurity in source region 14 is decreased, and at a position x4 in each of the $X_a$ direction and the $X_c$ direction, the concentration of the first impurity in source region 14 becomes the same as the concentration of the first impurity at position 0. A concentration a2 of the first impurity in source region 14 at each of position x1 and position x3 is 80% of concentration a3 of the first impurity at position x2. For example, impurity concentration a3 is $1 \times 10^{19}$ cm$^{-3}$, and impurity concentration a2 is $0.8 \times 10^{19}$ cm$^{-3}$.

Boundary portion 8b2 between metal layer 16a of source electrode 16 and source region 14 is located between position x1 and position x3 in the $X_a$ direction. In other words, the concentration of the first impurity in boundary portion 8b2 between source electrode 16 and source region 14 is not less than 80% of the maximum value of the concentration of the first impurity in source region 14 along the straight line that passes through intermediate point 14c between first contact point 14b and second contact point 16d and that is parallel to the normal line of first main surface 10a. Preferably, the concentration of the first impurity in boundary portion 8b2 between source electrode 16 and source region 14 is the same as the maximum value of the concentration of the first impurity in source region 14 along the straight line that passes through intermediate point 14c between first contact point 14b and second contact point 16d and that is parallel to the normal line of first main surface 10a.

Figure 4:
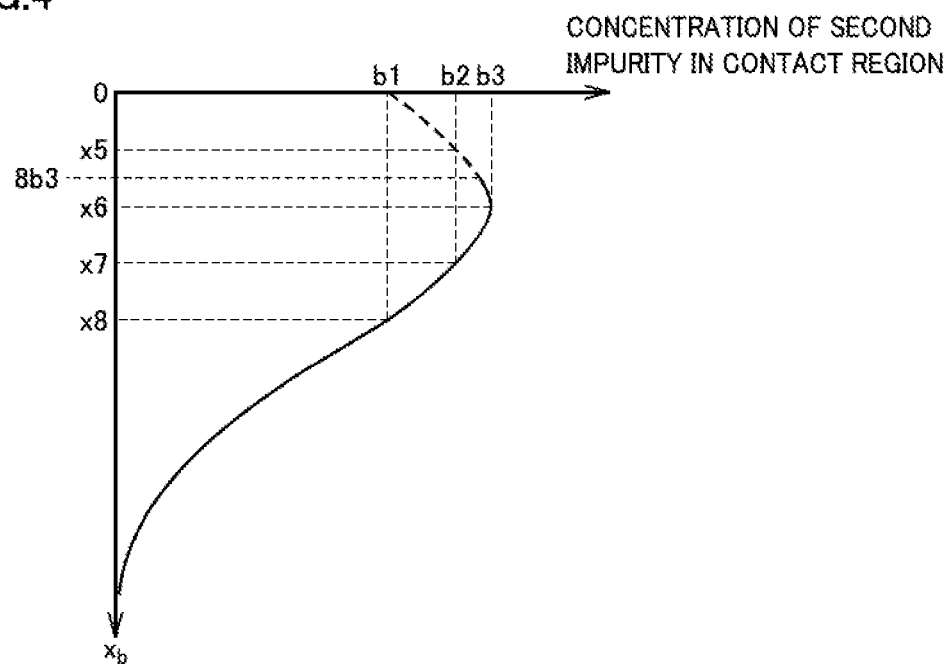
FIG. 4 shows a concentration distribution of a second impurity in a contact region in a direction $X_b$ in FIG. 2.

With reference to FIG. 4, the following describes a concentration distribution of the second impurity in contact region 18 in the normal direction of first main surface 10a of silicon carbide substrate 10. The second impurity contained in contact region 18 is aluminum, for example. As shown in FIG. 2, $X_b$, in FIG. 4 is a direction of extending longitudinally across contact region 18 in a direction parallel to the normal line of first main surface 10a of silicon carbide substrate 10. A position 0 in the $X_b$ direction is a position corresponding to first main surface 10a of silicon carbide substrate 10. A concentration of the second impurity at position 0 in metal layer 16a of source electrode 16 is represented as an impurity concentration b1. When getting away from first main surface 10a of silicon carbide substrate 10 toward the second main surface 10b side, the concentration of the second impurity in contact region 18 is increased and a maximum impurity concentration b3 is obtained at a position x6 in contact region 18. A distance from position 0 to position x6 in the $X_b$ direction is, for example, about not less than 0.01 μm and not more than 3.0 μm. When getting further away toward the second main surface 10b side, the concentration of the second impurity in contact region 18 is decreased, and at a position x8 in the $X_b$ direction, the concentration of the second impurity in contact region 18 becomes the same as the concentration of the second impurity at position 0. Concentration b2 of the second impurity in contact region 18 at each of position x5 and position x7 is 80% of concentration b3 of the second impurity at position x6. For example, impurity concentration b3 is $1\times10^{20}$ cm$^{-3}$ and impurity concentration b2 is $0.8\times10^{20}$ cm$^{-3}$.

Boundary portion 8b3 between metal layer 16a of source electrode 16 and contact region 18 is located between position x5 and position x7 in the $X_b$ direction. In other words, the concentration of the second impurity in boundary portion 8b3 between source electrode 16 and contact region 18 is not less than 80% of the maximum value of the concentration of the second impurity in contact region 18 in the normal direction of first main surface 10a of silicon carbide substrate 10. Preferably, the concentration of the second impurity in boundary portion 8b3 between source electrode 16 and contact region 18 is the same as the maximum value of the concentration of the second impurity in contact region 18 in the normal direction of first main surface 10a of silicon carbide substrate 10.

Figure 6:
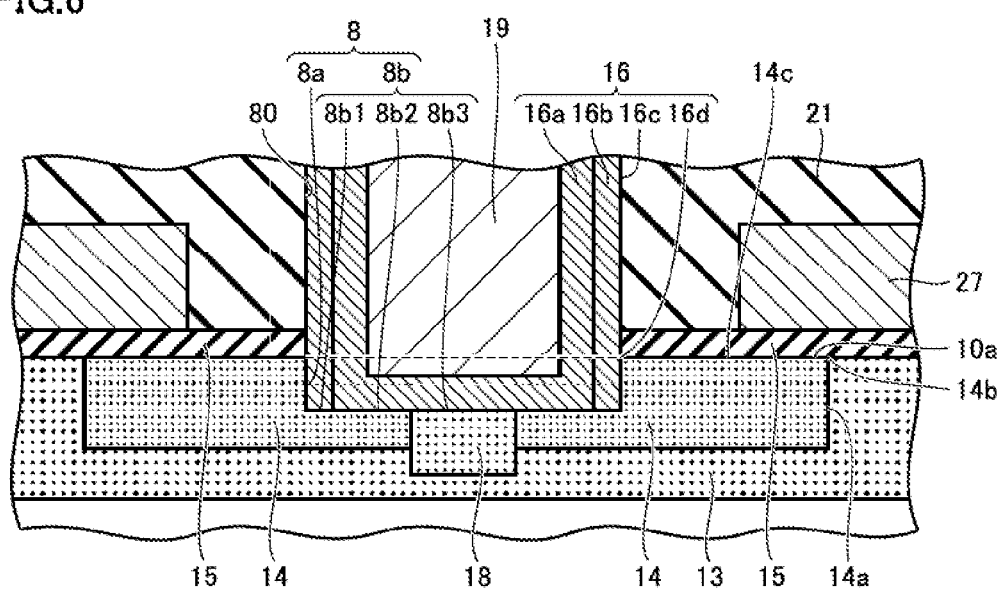
FIG. 6 is a schematic cross sectional view for schematically illustrating a structure of a modification of the silicon carbide semiconductor device according to the embodiment of the present invention.

With reference to FIG. 6, the thickness of a portion of metal layer 16a facing contact region 18 may be less than the depth of recess 8. In this case, the portion of metal layer 16a facing contact region 18 is disposed within recess 8. The depth of recess 8 is preferably not less than 10 nm and not more than 300 nm, for example, 70 nm. The thickness of the portion of metal layer 16a facing contact region 18 is, for example, not less than 10 nm and not more than 300 nm, for example, 60 nm. Front surface protecting electrode 19 may have a portion disposed in recess 8. As shown in FIG. 2, the thickness of the region of metal layer 16a facing contact region 18 may be more than the depth of recess 8.

The following describes an operation of MOSFET 1 according to the present embodiment. With reference to FIG. 1, when a voltage is applied between source electrode 16 and drain electrode 20 while an applied voltage to gate electrode 27 is less than a threshold voltage, i.e., while it is in OFF state, a pn junction formed between body region 13 and drift region 12 is reverse-biased. Accordingly, MOSFET 1 is in the non-conductive state. On the other hand, when gate electrode 27 is fed with a voltage equal to or more than the threshold voltage, an inversion layer is formed in a channel region CH near each of locations at which body regions 13 make contact with gate oxide film 15. As a result, source region 14 and drift region 12 are electrically connected to each other, whereby a current flows between source electrode 16 and drain electrode 20. In the manner described above, MOSFET 1 operates.

The following describes a method of manufacturing MOSFET 1 serving as the silicon carbide semiconductor device according to the present embodiment.

Figure 7:
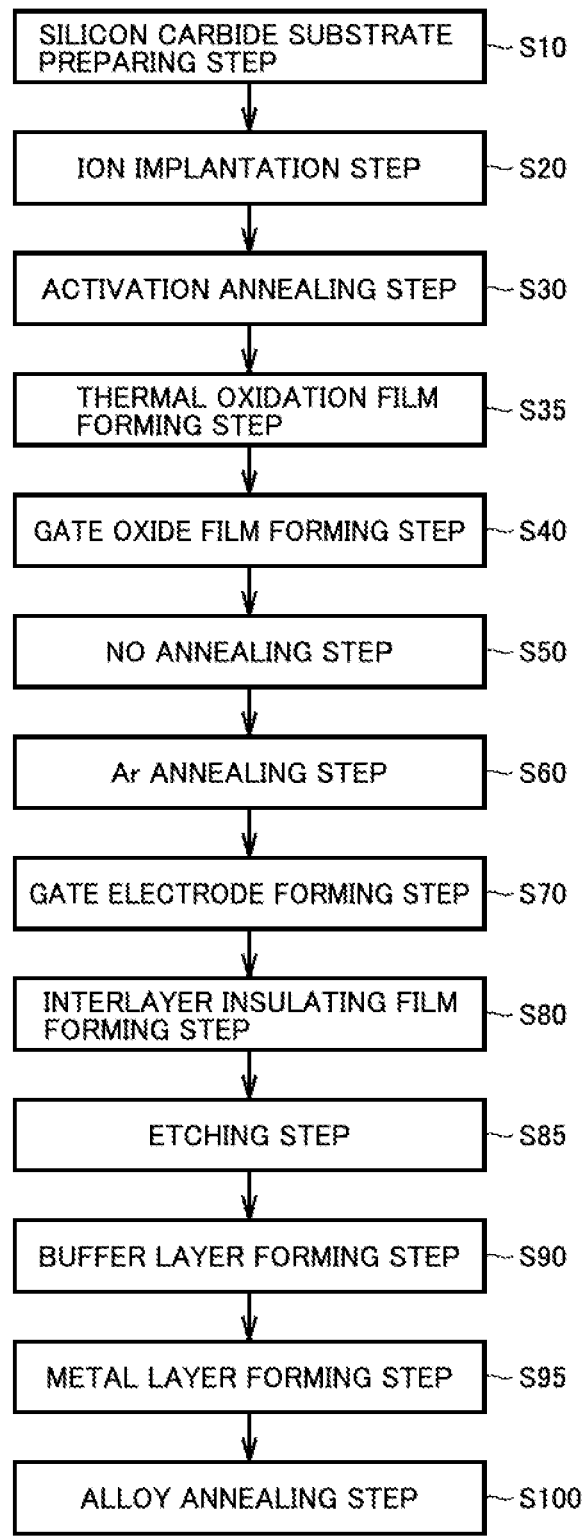
FIG. 7 is a flowchart for schematically illustrating a method of manufacturing the silicon carbide semiconductor device according to the embodiment of the present invention.
Figure 8:
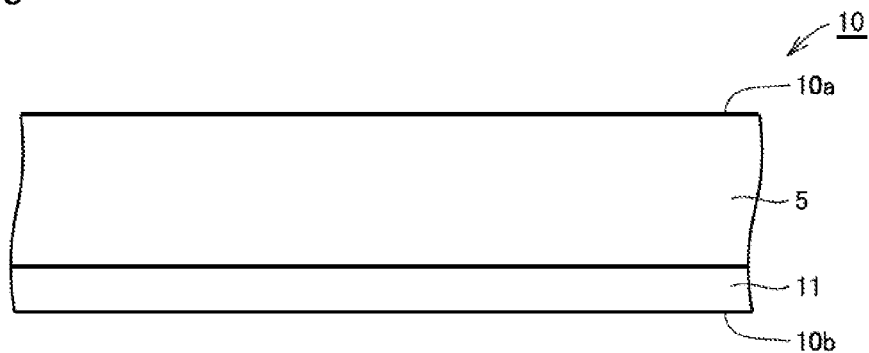
FIG. 8 is a schematic cross sectional view for schematically illustrating a first step of the method of manufacturing the silicon carbide semiconductor device according to the embodiment of the present invention.

First, a silicon carbide substrate preparing step (S10: FIG. 7) is performed. For example, silicon carbide single crystal substrate 11 is prepared by slicing an ingot made of a hexagonal silicon carbide single crystal, which has a polytype 4H and which is formed through a sublimation method. Next, silicon carbide epitaxial layer 5 is formed on silicon carbide single crystal substrate 11 through, for example, a CVD (Chemical Vapor Deposition) method. Specifically, silicon carbide single crystal substrate 11 is supplied with a carrier gas containing hydrogen ($H_2$) and a source material gas containing mono silane ($SiH_4$), propane ($C_3H_8$), nitrogen ($N_2$), and the like, and is then heated to, for example, about not less than 1500° C. and not more than 1700° C. Accordingly, as shown in FIG. 8, silicon carbide epitaxial layer 5 is formed on silicon carbide single crystal substrate 11. With this, silicon carbide substrate 10 is prepared which has first main surface 10a and second main surface 10b opposite to first main surface 10a. Silicon carbide substrate 10 includes: silicon carbide single crystal substrate 11 that forms second main surface 10b; and silicon carbide epitaxial layer 5 that is provided on silicon carbide single crystal substrate 11 and that forms first main surface 10a (see FIG. 8).

Figure 9:
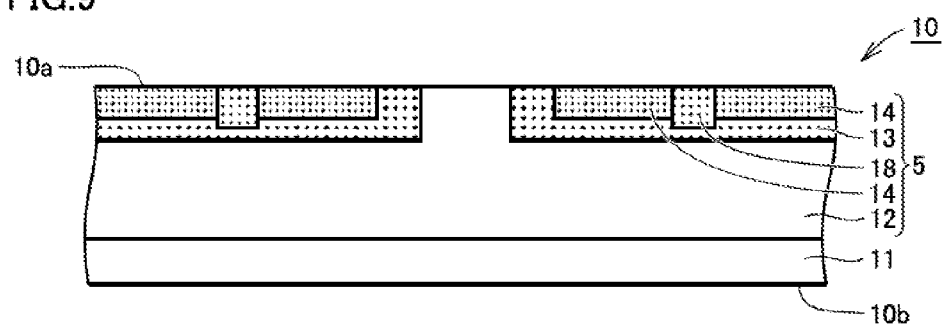
FIG. 9 is a schematic cross sectional view for schematically illustrating a second step of the method of manufacturing the silicon carbide semiconductor device according to the embodiment of the present invention.

Next, an ion implantation step (S20: FIG. 7) is performed. Specifically, with reference to FIG. 9, ions are implanted into first main surface 10a of silicon carbide substrate 10. For example, by implanting Al (aluminum) ions into first main surface 10a of silicon carbide substrate 10, body region 13 having a p type conductivity is formed in silicon carbide epitaxial layer 5. Body region 13 is an impurity region containing aluminum. Next, by implanting, for example, P (phosphorus) ions into body region 13 up to a depth shallower than the implantation depth of the Al ions, source region 14 having n type conductivity is formed. Source region 14 is an impurity region including the first impurity such as phosphorus. Next, for example, Al ions are implanted into source region 14 up to a depth deeper than source region 14 and shallower than body region 13. Accordingly, contact region 18 with p type conductivity is formed which is surrounded by source region 14 and extends from first main surface 10a into body region 13 in the normal direction of first main surface 10a of silicon carbide substrate 10. Contact region 18 is an impurity region containing the second impurity such as aluminum. In silicon carbide epitaxial layer 5, a region in which none of body region 13, source region 14, and contact region 18 is formed serves as drift region 12.

It should be noted that a through film (not shown) may be formed on first main surface 10a of silicon carbide substrate 10 and then the ion implantation may be performed into first main surface 10a of silicon carbide substrate 10 via the through film. As the through film, silicon dioxide, polysilicon, titanium, or the like can be used, for example. By using the through film, the position having the maximum value of the impurity concentration of the first impurity in source region 14 can be formed near first main surface 10a of silicon carbide substrate 10. Similarly, by using the through film, the position having the maximum value of the impurity concentration of the second impurity in contact region 18 can be formed near the first main surface 10a of silicon carbide substrate 10.

Next, an activation annealing step (S30: FIG. 7) is performed. Specifically, silicon carbide substrate 10 including body region 13, source region 14, and contact region 18 is heated at a temperature of not less than 1600° C. and not more than 2000° C. for about 30 minutes, for example. Accordingly, silicon carbide substrate 10 is provided with body region 13 having p type, source region 14 having n type, and contact region 18 having p type.

Figure 10:
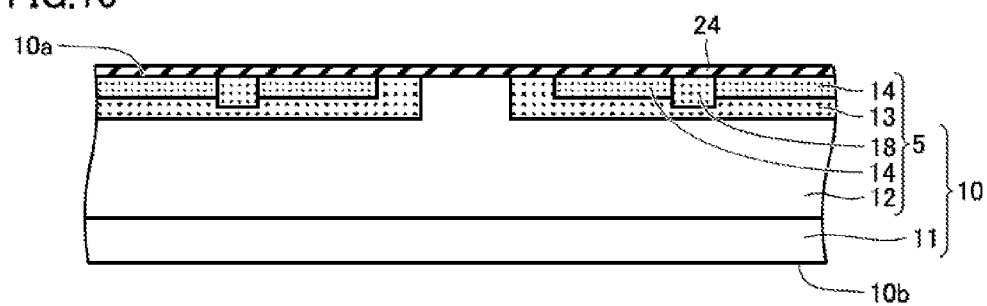
FIG. 10 is a schematic cross sectional view for schematically illustrating a third step of the method of manufacturing the silicon carbide semiconductor device according to the embodiment of the present invention.
Figure 11:
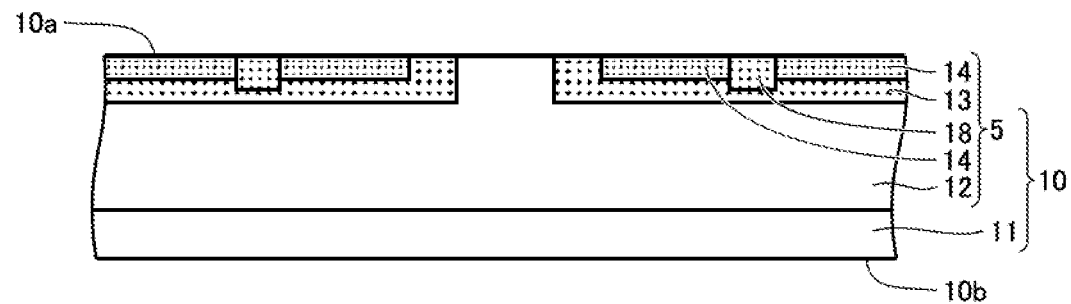
FIG. 11 is a schematic cross sectional view for schematically illustrating a fourth step of the method of manufacturing the silicon carbide semiconductor device according to the embodiment of the present invention.

Next, a thermal oxidation film forming step (S35: FIG. 7) is performed. With reference to FIG. 10, by thermally oxidizing first main surface 10a of silicon carbide substrate 10 after forming each of source region 14 and contact region 18 in silicon carbide substrate 10, an oxide film 24 is formed at first main surface 10a of silicon carbide substrate 10. Oxide film 24 is formed to incorporate a portion of a region constituting first main surface 10a of silicon carbide substrate 10. In other words, the position of the interface between first main surface 10a of silicon carbide substrate 10 and oxide film 24 after the formation of oxide film 24 is located at the second main surface 10b side of silicon carbide substrate 10 relative to the position of first main surface 10a of silicon carbide substrate 10 before the formation of oxide film 24. Oxide film 24 is formed in contact with each of drift region 12, body region 13, source region 14, and contact region 18 at first main surface 10a of silicon carbide substrate 10. Next, oxide film 24 is removed from first main surface 10a of silicon carbide substrate 10 (see FIG. 11). The thermal oxidation film forming step (S35: FIG. 7) is performed before a metal layer forming step (S95: FIG. 7) described below.

Figure 12:
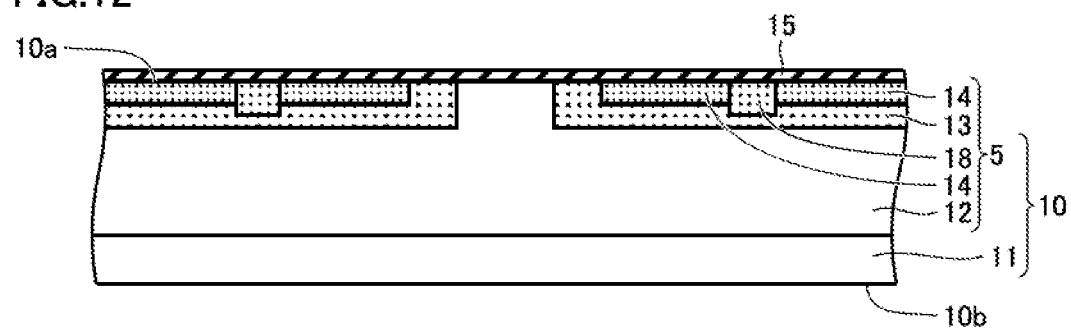
FIG. 12 is a schematic cross sectional view for schematically illustrating a fifth step of the method of manufacturing the silicon carbide semiconductor device according to the embodiment of the present invention.

Next, a gate oxide film forming step (S40: FIG. 7) is performed. Specifically, silicon carbide substrate 10 having body region 13, source region 14, and contact region 18 formed at the first main surface 10a side of silicon carbide substrate 10 is placed in a heating furnace. While maintaining a state in which nitrogen gas is in the heating furnace, the temperature of silicon carbide substrate 10 is increased by heating from the room temperature to 1300° C. After silicon carbide substrate 10 reaches 1300° C., an oxygen gas is introduced into the heating furnace. By retaining silicon carbide substrate 10 at a temperature of about 1300° C. for about 1 hour under the oxygen atmosphere, gate oxide film 15 is formed on first main surface 10a of silicon carbide substrate 10. In this way, gate oxide film 15 made of silicon dioxide is formed to cover first main surface 10a of silicon carbide substrate 10 (see FIG. 12). Gate oxide film 15 is formed in contact with drift region 12, body region 13, source region 14, and contact region 18 at first main surface 10a of silicon carbide substrate 10. Gate oxide film 15 has a thickness of about 50 nm, for example.

Next, a NO annealing step (S50: FIG. 7) is performed. Specifically, under an atmosphere containing nitrogen, silicon carbide substrate 10 having gate oxide film 15 formed thereon is heated at a temperature of about 1300° C. Examples of the gas containing nitrogen include nitrogen monoxide (NO), dinitrogen oxide, nitrogen dioxide, ammonia, and the like. Preferably, silicon carbide substrate 10 having gate oxide film 15 formed thereon is retained at a temperature of not less than 1300° C. and not more than 1500° C. for about 1 hour under the gas containing nitrogen, for example.

Next, an Ar annealing step (S60: FIG. 7) is performed. Specifically, under an inert gas atmosphere such as argon, silicon carbide substrate 10 having gate oxide film 15 formed thereon is heated at a temperature of about 1300° C. Preferably, under the argon gas, silicon carbide substrate 10 having gate oxide film 15 formed thereon is retained at a temperature of not less than 1100° C. and not more than 1500° C. for about 1 hour, for example. More preferably, silicon carbide substrate 10 having gate oxide film 15 formed thereon is maintained at a temperature of not less than 1300° C. and not more than 1500° C.

Figure 13:
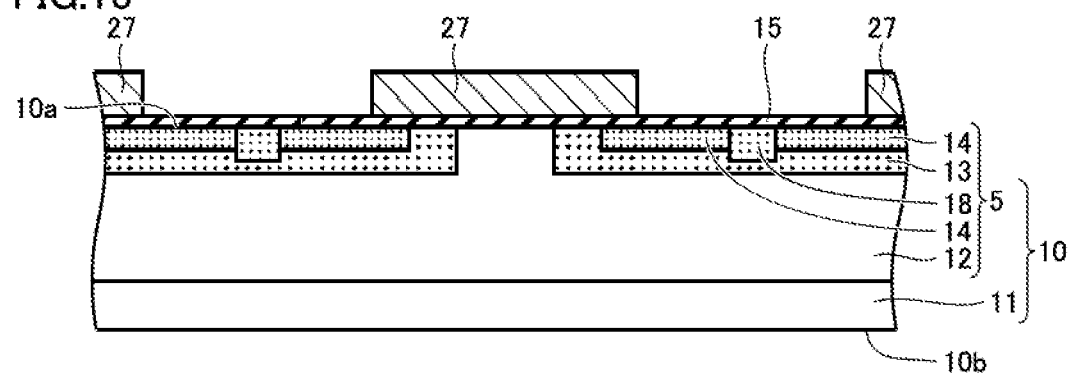
FIG. 13 is a schematic cross sectional view for schematically illustrating a sixth step of the method of manufacturing the silicon carbide semiconductor device according to the embodiment of the present invention.

Next, a gate electrode forming step (S70: FIG. 7) is performed. For example, an LPCVD (Low Pressure Chemical Vapor Deposition) method is employed to form, on gate oxide film 15, gate electrode 27 made of polysilicon containing an impurity. Gate electrode 27 is formed to face drift region 12, source region 14, and body region 13 with gate oxide film 15 being interposed therebetween (see FIG. 13).

Figure 14:
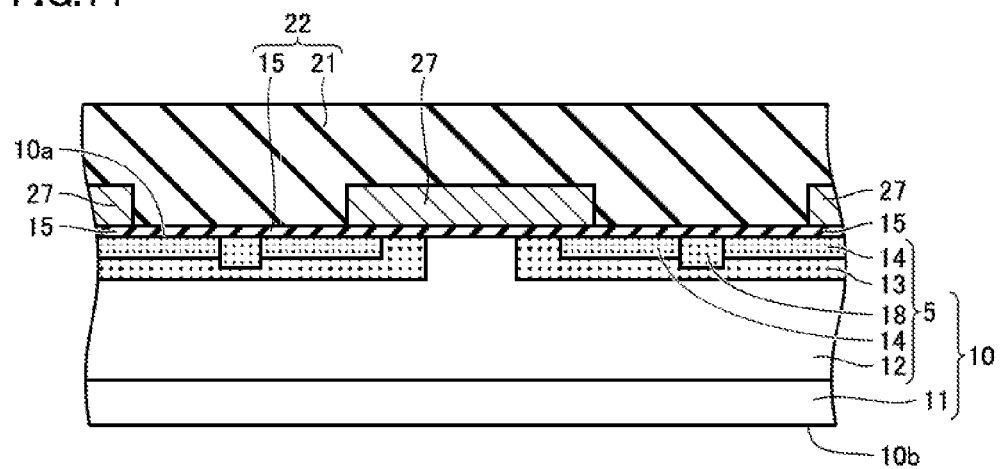
FIG. 14 is a schematic cross sectional view for schematically illustrating a seventh step of the method of manufacturing the silicon carbide semiconductor device according to the embodiment of the present invention.

Next, an interlayer insulating film forming step (S80: FIG. 7) is performed. For example, interlayer insulating film 21 made of silicon dioxide is formed to cover gate oxide film 15 and gate electrode 27. Specifically, under a temperature of, for example, about not less than 650° C. and not more than 750° C., TEOS (Tetraethylorthosilicate) gas is supplied onto silicon carbide substrate 10 for about 6 hours. Accordingly, interlayer insulating film 21 is formed such that gate electrode 27 is covered with gate oxide film 15 and interlayer insulating film 21. Gate oxide film 15 and interlayer insulating film 21 constitute insulating film 22 (see FIG. 14).

Figure 15:
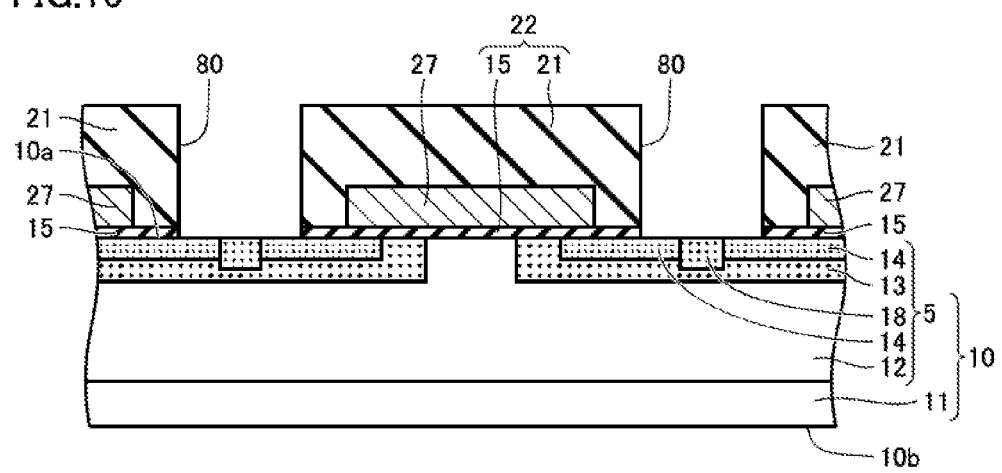
FIG. 15 is a schematic cross sectional view for schematically illustrating an eighth step of the method of manufacturing the silicon carbide semiconductor device according to the embodiment of the present invention.

Next, an etching step (S85: FIG. 7) is performed. With reference to FIG. 15, a portion of insulating film 22 including interlayer insulating film 21 and gate oxide film 15 is removed from a region in which source electrode 16 is to be formed. Accordingly, insulating film 22 is formed to face first main surface 10a of silicon carbide substrate 10 and to have opening 80 through which at least a portion of source region 14 is exposed. Preferably, insulating film 22 is etched to expose each of source region 14 and contact region 18 through insulating film 22 including interlayer insulating film 21 and gate oxide film 15. When etching insulating film 22 made of silicon dioxide, $CF_4$ can be used as an etching gas.

Next, a source electrode forming step is performed. The source electrode forming step includes a buffer layer forming step (S90: FIG. 7), a metal layer forming step (S95: FIG. 7), and an alloy annealing step (S100: FIG. 7), for example.

Figure 16:
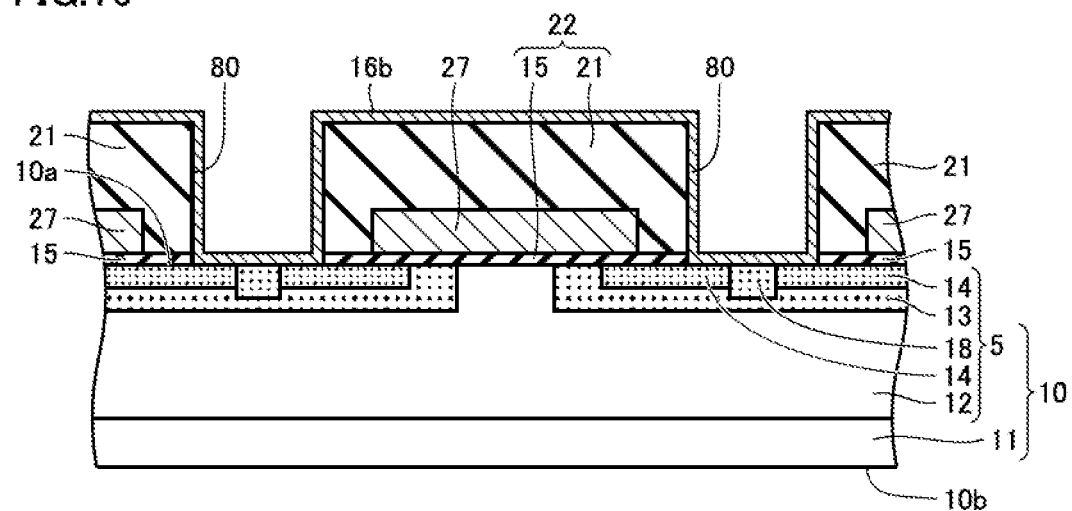
FIG. 16 is a schematic cross sectional view for schematically illustrating a ninth step of the method of manufacturing the silicon carbide semiconductor device according to the embodiment of the present invention.
Figure 17:
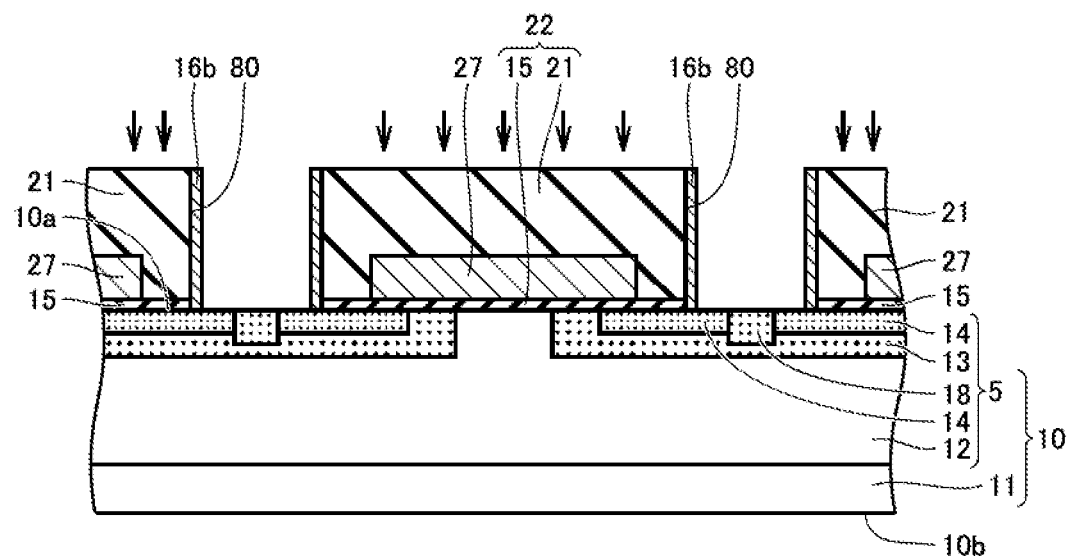
FIG. 17 is a schematic cross sectional view for schematically illustrating a tenth step of the method of manufacturing the silicon carbide semiconductor device according to the embodiment of the present invention.

Next, the buffer layer forming step (S90: FIG. 7) is performed. With reference to FIG. 16, buffer layer 16b is formed in contact with each of source region 14 and contact region 18 at first main surface 10a of silicon carbide substrate 10. Moreover, buffer layer 16b is in contact with each of insulating film 22 and source region 14 in opening 80, and is in contact with the surface of insulating film 22 outside opening 80. Buffer layer 16b is made of a material not containing aluminum, preferably, is made of a material containing titanium and nitrogen. Buffer layer 16b may be TiN, TaN, TiW, WN, or the like, for example Next, with reference to FIG. 17, dry etching is performed in a direction of arrows from the first main surface 10a side of silicon carbide substrate 10, for example. For example, when etching buffer layer 16b made of TiN, $Cl_2$, $BCl_3$ or the like can be used as the etching gas. In this way, buffer layer 16b is removed from above source region 14 and contact region 18 and from the surface of insulating film 22 while buffer layer 16b in contact with insulating film 22 in opening 80 is remained.

Figure 18:
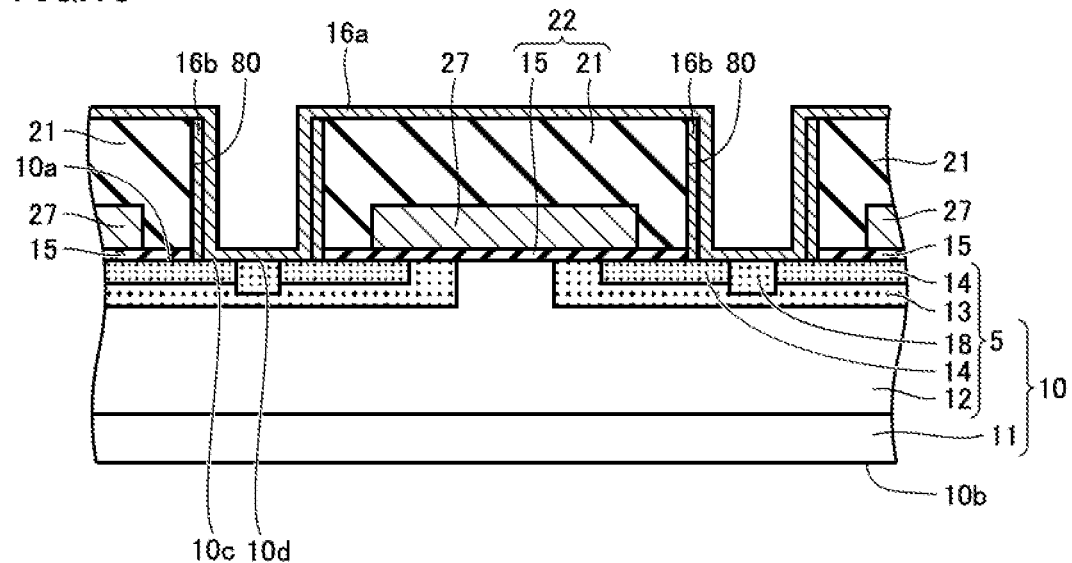
FIG. 18 is a schematic cross sectional view for schematically illustrating an eleventh step of the method of manufacturing the silicon carbide semiconductor device according to the embodiment of the present invention.

Next, the metal layer forming step (S95: FIG. 7) is performed. With reference to FIG. 18, metal layer 16a is formed in contact with each of source region 14 and contact region 18 at first main surface 10a of silicon carbide substrate 10. Moreover, metal layer 16a is in contact with each of source region 14 and buffer layer 16b in opening 80. Metal layer 16a is made of a material containing aluminum. Preferably, metal layer 16a contains Ti, Al, and Si. Metal layer 16a is formed, for example, through a sputtering method. Next, most of metal layer 16a is removed from the surface of insulating film 22. Metal layer 16a is removed by performing, for example, dry etching in a direction of arrows from the first main surface 10a side of silicon carbide substrate 10 using a mask not shown in the figure (see FIG. 19).

Figure 19:
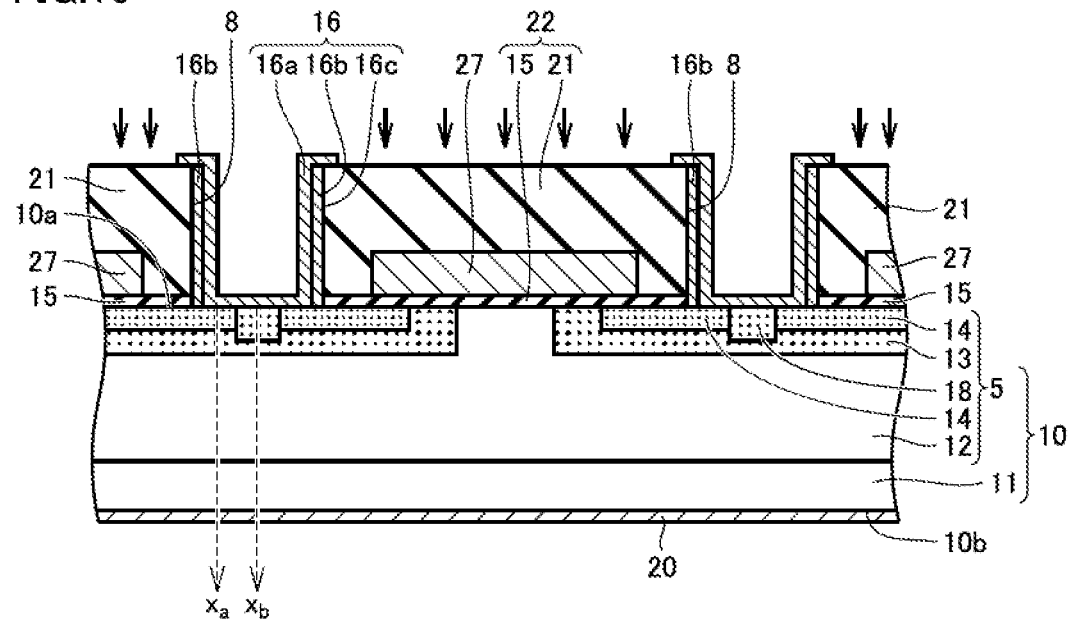
FIG. 19 is a schematic cross sectional view for schematically illustrating a twelfth step of the method of manufacturing the silicon carbide semiconductor device according to the embodiment of the present invention.
Figure 20:
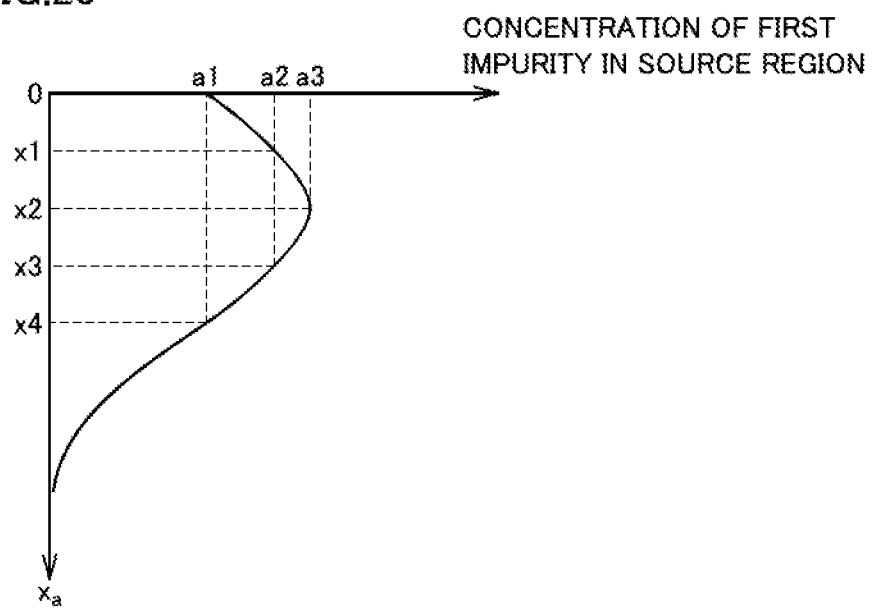
FIG. 20 shows a concentration distribution of the first impurity in the source region in a direction $X_a$ in FIG. 19.

With reference to FIG. 20, the following describes a concentration distribution of the first impurity in source region 14 in the normal direction of first main surface 10a of silicon carbide substrate 10. The first impurity contained in source region 14 is phosphorus, for example. As shown in FIG. 20, direction $X_a$ in FIG. 19 is a direction of extending longitudinally across source region 14 in the normal direction of boundary portion 10c between metal layer 16a and source region 14. Position 0 in the $X_a$ direction is a position corresponding to first main surface 10a of silicon carbide substrate 10.

The concentration of the first impurity contained in source region 14 in first main surface 10a of silicon carbide substrate 10 is represented as impurity concentration a1. As shown in FIG. 20, when getting away from first main surface 10a of silicon carbide substrate 10 toward the second main surface 10b side, the concentration of the first impurity in source region 14 is increased and maximum impurity concentration a3 is obtained at position x2 in source region 14. When getting further away toward the second main surface 10b side, the concentration of the first impurity in source region 14 is decreased, and at position x4 in the $X_a$ direction, the concentration of the first impurity in source region 14 becomes the same as the concentration of the first impurity at position 0. Concentration a2 of the first impurity in source region 14 at each of position x1 and position x3 is 80% of concentration a3 of the first impurity at position x2. As shown in FIG. 20, in the metal layer forming step (S95: FIG. 7), metal layer 16a is formed such that the concentration of the first impurity at boundary portion 10c between metal layer 16a and source region 14 becomes less than the maximum value of the concentration of the first impurity in source region 14 in the normal direction of first main surface 10a of silicon carbide substrate 10.

Figure 21:
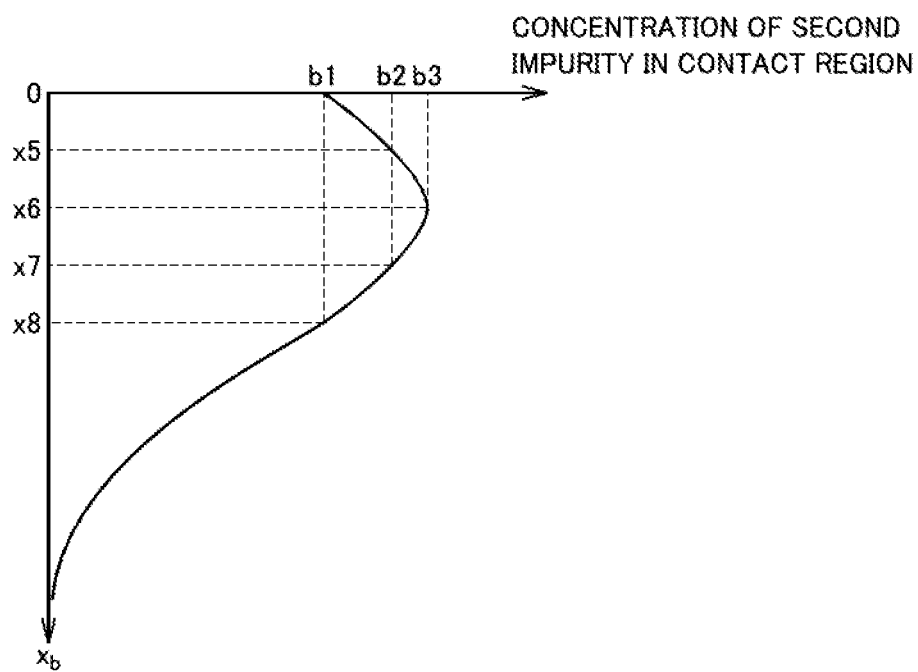
FIG. 21 shows a concentration distribution of the second impurity in the contact region in a direction $X_b$ in FIG. 19.

With reference to FIG. 21, the following describes a concentration distribution of the second impurity in contact region 18 in the normal direction of first main surface 10a of silicon carbide substrate 10. The second impurity contained in contact region 18 is aluminum, for example. As shown in FIG. 19, $X_b$ in FIG. 21 is a direction of extending longitudinally across contact region 18 in a direction parallel to the normal line of first main surface 10a of silicon carbide substrate 10. Position 0 in the $X_b$ direction is a position corresponding to first main surface 10a of silicon carbide substrate 10.

The concentration of the second impurity in first main surface 10a of silicon carbide substrate 10 is represented as impurity concentration b1. When getting away from first main surface 10a of silicon carbide substrate 10 toward the second main surface 10b side, the concentration of the second impurity of contact region 18 is increased and maximum impurity concentration b3 is obtained at position x6 in contact region 18. When getting further away toward the second main surface 10b side, the concentration of the second impurity in contact region 18 is decreased, and at position x8 in the $X_b$ direction, the concentration of the second impurity of contact region 18 becomes the same as the concentration of the second impurity at position 0. Concentration b2 of the second impurity in contact region 18 at each of position x5 and position x7 is 80% of concentration b3 of the second impurity at position x6. As shown in FIG. 21, metal layer 16a is formed such that the concentration of the second impurity at boundary portion 10d between metal layer 16a and contact region 18 becomes less than the maximum value of the concentration of the second impurity in contact region 18 in the normal direction of first main surface 10a of silicon carbide substrate 10.

Next, the alloy annealing step (S100: FIG. 7) is performed. Specifically, by annealing each of silicon carbide substrate 10, metal layer 16a, and buffer layer 16b, source electrode 16 is formed. More specifically, a heat treatment of for example, not less than 900° C. and not more than 1100° C. is performed for about 5 minutes onto silicon carbide substrate 10 provided with metal layer 16a provided in contact with each of source region 14 and contact region 18 at first main surface 10a of silicon carbide substrate 10 and buffer layer 16b formed in contact with the side wall surface constituting opening 80. Accordingly, at least a portion of metal layer 16a reacts with silicon contained in the silicon carbide substrate and is silicided, thereby forming an alloy layer. In this way, source electrode 16 is formed which includes the alloy layer making ohmic contact with source region 14. Preferably, source electrode 16 includes an alloy layer making ohmic contact with each of source region 14 and contact region 18. The portion of source electrode 16 in contact with at least source region 14 is the alloy layer.

Figure 22:
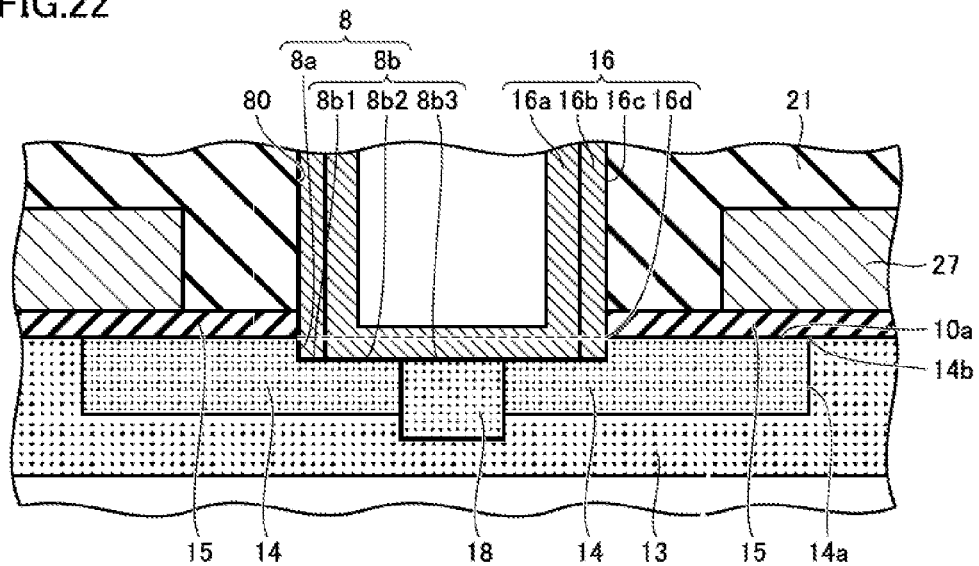
FIG. 22 is a schematic cross sectional view for schematically illustrating a thirteenth step of the method of manufacturing the silicon carbide semiconductor device according to the embodiment of the present invention.

The alloy layer constituting at least a portion of source electrode 16 is formed to react with a portion of silicon carbide substrate 10 and incorporate silicon carbide, so that the bottom portion of the alloy layer (i.e., boundary portion 8b2 between source electrode 16 and source region 14) is formed at the second main surface 10b side of silicon carbide substrate 10 relative to boundary portion 10c between metal layer 16a and silicon carbide substrate 10. That is, as shown in FIG. 22, source electrode 16 is formed in contact with each of side portion 8a and bottom portion 8b of recess 8 formed in first main surface 10a of silicon carbide substrate 10. Bottom portion 8b of recess 8 includes boundary portion 8b2 between source electrode 16 and source region 14.

Source electrode 16 is formed such that the concentration of the first impurity at boundary portion 8b2 between source electrode 16 and source region 14 after the alloy annealing step becomes not less than 80% of the maximum value of the concentration of the first impurity contained in source region 14 in the normal direction of first main surface 10a of silicon carbide substrate 10 before the alloy annealing step. Likewise, source electrode 16 is formed such that the concentration of the second impurity at boundary portion 8b3 between source electrode 16 and contact region 18 after the alloy annealing step becomes not less than 80% of the maximum value of the concentration of the second impurity contained in contact region 18 in the normal direction of first main surface 10a before the alloy annealing.

In other words, boundary portion 8b2 between metal layer 16a of source electrode 16 and source region 14 after the alloy annealing step is located between position x1 and position x3 in the $X_a$ direction (see FIG. 20). Preferably, boundary portion 8b3 between metal layer 16a of source electrode 16 and contact region 18 after the alloy annealing step is located between position x5 and position x7 in the $X_b$ direction (see FIG. 21). Preferably, boundary portion 8b2 between metal layer 16a of source electrode 16 and source region 14 after the alloy annealing step is located at position x2 in the $X_a$ direction. Preferably, boundary portion 8b3 between metal layer 16a of source electrode 16 and contact region 18 after the alloy annealing step is located at position x6 in the $X_b$ direction.

Next, front surface protecting electrode 19 is formed in contact with source electrode 16 to cover interlayer insulating film 21. Front surface protecting electrode 19 is preferably made of a material containing Al and is, for example, AlSiCu. After the formation of front surface protecting electrode 19, a lamp annealing step may be performed. In the lamp annealing step, silicon carbide substrate 10 having front surface protecting electrode 19 provided thereon is heated at a temperature of, for example, not less than 700° C. and not more than 800° C. for about 30 seconds, for example.

Next, drain electrode 20 made of, for example, NiSi is formed in contact with second main surface 10b of silicon carbide substrate 10. Drain electrode 20 may be TiAlSi or the like, for example. Drain electrode 20 is preferably formed by the sputtering method, but vapor deposition may be employed therefor. After drain electrode 20 is formed, drain electrode 20 is heated by, for example, laser annealing. Accordingly, at least a portion of drain electrode 20 is silicided, thereby forming drain electrode 20 making ohmic contact with silicon carbide single crystal substrate 11. Next, backside surface protecting electrode 23 is formed in contact with drain electrode 20. Backside surface protecting electrode 23 is made of a material containing Al, for example. In the manner described above, MOSFET 1 shown in FIG. 1 is manufactured.

Figure 23:
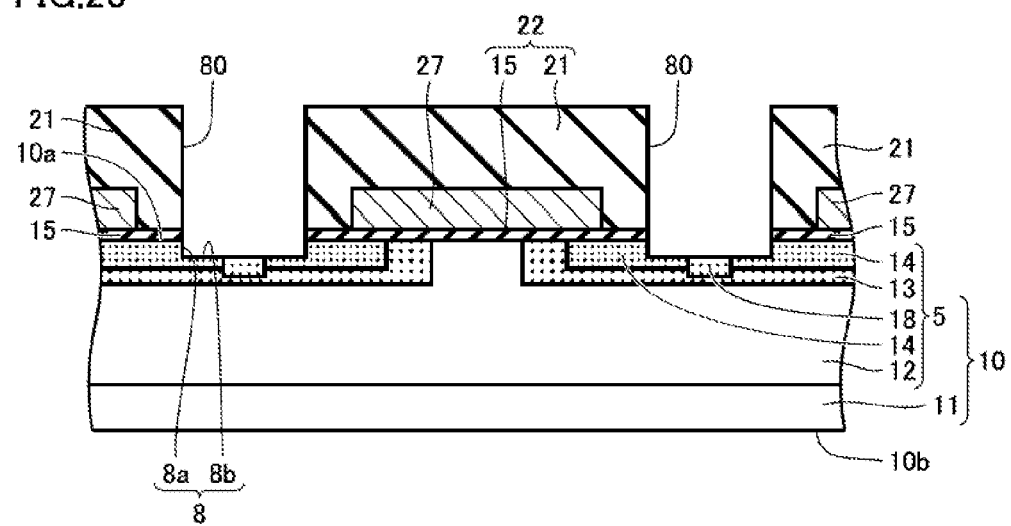
FIG. 23 is a schematic cross sectional view for schematically illustrating a modification of the eighth step of the method of manufacturing the silicon carbide semiconductor device according to the embodiment of the present invention.

It should be noted that preferably in the etching step (S85: FIG. 7), after forming each of source region 14 and contact region 18 in silicon carbide substrate 10 and before forming metal layer 16a, each of source region 14 and contact region 18 of silicon carbide substrate 10 may be etched to form recess 8 in first main surface 10a of silicon carbide substrate 10 (see FIG. 23). An etching gas used for the etching is $SF_6$ gas, Ar gas, or $Cl_2$ gas, for example. As the etching gas, a mixed gas of $SF_6$ and Ar may be used. Moreover, the etching is performed by using the above-described gas and heating silicon carbide substrate 10 having a mask formed thereon for about 2 hours at not less than 1100° C. and not more than 1300° C., for example. Recess 8 is formed to include side portion 8a continuous to first main surface 10a of silicon carbide substrate 10 and bottom portion 8b continuous to side portion 8a. Side portion 8a of recess 8 is constituted of source region 14, and bottom portion 8b of recess 8 is constituted of source region 14 and contact region 18.

When recess 8 is formed in first main surface 10a of silicon carbide substrate 10, in the buffer layer forming step (S90: FIG. 7), buffer layer 16b is formed in contact with each of side portion 8a and bottom portion 8b of recess 8. Moreover, in the metal layer forming step (S95: FIG. 7), metal layer 16a is formed in contact with each of source region 14 and contact region 18 at bottom portion 8b of recess 8.

Although it has been illustrated that the first conductivity type is n type and the second conductivity type is p type in the embodiment described above, the first conductivity type may be p type and the second conductivity type may be n type. In the description above, the planer type MOSFET has been illustrated as one example of the silicon carbide semiconductor device, but the silicon carbide semiconductor device may be a trench type MOSFET, an IGBT (Insulated Gate Bipolar Transistor), or the like, for example.

The following describes function and effect of MOSFET 1 serving as the silicon carbide semiconductor device according to the present embodiment and the method of manufacturing MOSFET 1.

According to the method of manufacturing MOSFET 1 according to the embodiment, source electrode 16 is formed such that the concentration of the first impurity at boundary portion 8b2 between source electrode 16 and source region 14 becomes not less than 80% of the maximum value of the concentration of the first impurity in source region 14 in the normal direction. Accordingly, the concentration of the first impurity at boundary portion 8b2 between source electrode 16 and source region 14 becomes high, thereby effectively reducing a contact resistance between source region 14 included in silicon carbide substrate 10 and source electrode 16.

Furthermore, the method of manufacturing MOSFET 1 according to the embodiment may further include the step of forming a recess 8 by etching source region 14 of silicon carbide substrate 10 after the step of forming source region 14 and before the step of forming metal layer 16a. In the step of forming metal layer 16a, metal layer 16a is formed in contact with source region 14 at a bottom portion 8b of recess 8. Accordingly, a contact area between source region 14 and metal layer 16a becomes large, thereby more effectively reducing the contact resistance between source region 14 included in silicon carbide substrate 10 and source electrode 16. Moreover, by etching source region 14, the region having a high concentration of the first impurity can be effectively exposed at the surface of source region 14.

Furthermore, the method of manufacturing MOSFET 1 according to the embodiment may further include the steps of: thermally oxidizing first main surface 10a of silicon carbide substrate 10 after the step of forming source region 14 and before the step of forming metal layer 16a; and removing an oxide film 24 formed by the step of thermally oxidizing first main surface 10a. In this way, when the position having the maximum value of the concentration of the first impurity in source region 14 is located at a position distant away from first main surface 10a of silicon carbide substrate 10, the position having the maximum value of the concentration of the first impurity can be located near first main surface 10a of silicon carbide substrate 10.

Furthermore, the method of manufacturing MOSFET 1 according to the embodiment may further include the step of forming a contact region 18 having a second conductivity type and in contact with source region 14 by ion implantation of a second impurity into first main surface 10a of silicon carbide substrate 10 before the step of forming metal layer 16a. In the step of forming metal layer 16a, metal layer 16a is formed in contact with each of source region 14 and contact region 18. Source electrode 16 is formed such that a concentration of the second impurity at a boundary portion 8b3 between source electrode 16 and contact region 18 becomes not less than 80% of a maximum value of a concentration of the second impurity in contact region 18 in the normal direction after the step of forming source electrode 16. Accordingly, the concentration of the second impurity at boundary portion 8b3 between source electrode 16 and contact region 18 becomes high, thereby effectively reducing the contact resistance between contact region 18 included in silicon carbide substrate 10 and source electrode 16.

Furthermore, the method of manufacturing MOSFET 1 according to the embodiment may further include, after the step of forming source region 14 and before the step of forming metal layer 16a, the steps of forming an insulating film 22 having an opening 80 which faces first main surface 10a of silicon carbide substrate 10 and through which at least a portion of source region 14 is exposed; and forming a buffer layer 16b that is in contact with each of insulating film 22 and source region 14 in opening 80 and that contains no aluminum; and removing buffer layer 16b from above source region 14 while buffer layer 16b in contact with insulating film 22 in opening 80 remains. In the step of forming metal layer 16a, metal layer 16a is formed in contact with each of source region 14 and buffer layer 16b in opening 80, metal layer 16a containing aluminum. In the step of forming source electrode 16, source electrode 16 is formed by annealing silicon carbide substrate 10, metal layer 16a, and buffer layer 16b. Since buffer layer 16b is in contact with insulating film 22, aluminum contained in metal layer 16a can be suppressed from being spread in insulating film 22. Accordingly, an insulating property between gate electrode 27 and source electrode 16 can be suppressed from being decreased.

Furthermore, according to the method of manufacturing MOSFET 1 according to the embodiment, buffer layer 16*b* may contain titanium and nitrogen. In this way, adhesion between source electrode 16 and insulating film 22 can be improved.

According to MOSFET 1 according to the embodiment, the concentration of the first impurity at boundary portion 8*b*2 between source electrode 16 and source region 14 is not less than 80% of the maximum value of the concentration of the first impurity of source region 14 along the straight line that passes through intermediate point 14*c* between first contact point 14*b* and second contact point 16*d* and that is parallel to the normal line of first main surface 10*a*, first contact point 14*b* being the contact point between outer circumferential end portion 14*a* of source region 14 and first main surface 10*a* and second contact point 16*d* being the contact point between side portion 8*a* of recess 8 and first main surface 10*a* when viewed in the cross section. Accordingly, the concentration of the first impurity in boundary portion 8*b*2 between source electrode 16 and source region 14 becomes high, thereby effectively reducing the contact resistance between source region 14 included in silicon carbide substrate 10 and source electrode 16.

Furthermore, according to MOSFET 1 according to the embodiment, silicon carbide substrate 10 may include a contact region 18 that is in contact with each of source region 14 and source electrode 16, that has a second conductivity type, and that has a second impurity. A concentration of the second impurity at a boundary portion 8*b*3 between source electrode 16 and contact region 18 is not less than 80% of a maximum value of a concentration of the second impurity in contact region 18 in a normal direction of the first main surface. Accordingly, the concentration of the second impurity at boundary portion 8*b*3 between source electrode 16 and contact region 18 becomes high, thereby effectively reducing the contact resistance between contact region 18 included in silicon carbide substrate 10 and source electrode 16.

Furthermore, MOSFET 1 according to the embodiment may further include an interlayer insulating film 21 provided at a position facing first main surface 10*a* of silicon carbide substrate 10. Source electrode 16 includes a buffer layer 16*b* that is in contact with interlayer insulating film 21 and a metal layer 16*a* that is separated from interlayer insulating film 21 by buffer layer 16*b* and that is in contact with source region 14 at bottom portion 8*b* of recess 8. Buffer layer 16*b* is made of a material not containing aluminum and metal layer 16*a* is made of a material containing aluminum. Since buffer layer 16*b* is in contact with insulating film 22, aluminum contained in metal layer 16*a* can be suppressed from being spread in insulating film 22. Accordingly, an insulating property between gate electrode 27 and source electrode 16 can be suppressed from being decreased.

Furthermore, according to MOSFET 1 according to the embodiment, buffer layer 16*b* may contain titanium and nitrogen. In this way, adhesion between source electrode 16 and insulating film 22 can be improved.

Although the embodiments of the present invention has been described, the embodiments disclosed herein are illustrative and non-restrictive in any respect. The scope of the present invention is defined by the terms of the claims, and is intended to include any modifications within the scope and meaning equivalent to the terms of the claims.

What is claimed is:

1. A method of manufacturing a silicon carbide semiconductor device, comprising the steps of:

preparing a silicon carbide substrate having a first main surface and a second main surface opposite to said first main surface;

forming a first impurity region having a first conductivity type through ion implantation of a first impurity into said first main surface of said silicon carbide substrate, wherein a concentration profile of said first impurity in said first impurity region is completed by said ion implantation, said concentration profile being such that a concentration of said first impurity at a first boundary portion between a metal layer and said first impurity region is less than a maximum value of a concentration of said first impurity in said first impurity region in a normal direction of said first main surface;

forming a recess by etching said first impurity region of said silicon carbide substrate after the step of forming said first impurity region;

forming a buffer layer that is in contact with said first impurity region and that contains no aluminum, wherein said buffer layer is in contact with said first impurity region at a bottom portion of said recess formed in said first main surface;

forming said metal layer in contact with said first impurity region;

forming an electrode by annealing said silicon carbide substrate and said metal layer, in the step of forming said metal layer, said metal layer is deposited on said silicon carbide substrate having said concentration profile, said electrode being formed such that the concentration of said first impurity at a second boundary portion between said electrode and said first impurity region becomes not less than 80% of the maximum value of the concentration of said first impurity in said first impurity region in said normal direction after the step of forming said electrode; and after the step of forming said first impurity region and before the step of forming said metal layer, the steps of: forming an insulating film having an opening which faces said first main surface of said silicon carbide substrate and through which at least a portion of said first impurity region is exposed; and removing said buffer layer from above said first impurity region while said buffer layer in contact with said insulating film in said opening remains, wherein in the step of forming said metal layer, said metal layer is formed in contact with each of said first impurity region and said buffer layer in said opening, said metal layer containing aluminum, and in the step of forming said electrode, said electrode is formed by annealing said silicon carbide substrate, said metal layer, and said buffer layer.

2. The method of manufacturing the silicon carbide semiconductor device according to claim 1, further comprising the steps of:

thermally oxidizing said first main surface of said silicon carbide substrate after the step of forming said first impurity region and before the step of forming said metal layer; and removing an oxide film formed by the step of thermally oxidizing said first main surface.

3. The method of manufacturing the silicon carbide semiconductor device according to claim 1, further comprising the step of forming a second impurity region having a second conductivity type and in contact with said first impurity region by ion implantation of a second impurity into said first main surface of said silicon carbide substrate before the step of forming said metal layer, wherein in the step of forming said metal layer, said metal layer is formed in contact with each of said first impurity region and said second impurity region, and said electrode is formed such that a concentration of said second impurity at a boundary portion between said electrode and said second impurity region becomes not less than 80% of a maximum value of a concentration of said second impurity in said second impurity region in said normal direction after the step of forming said electrode.

4. The method of manufacturing the silicon carbide semiconductor device according to claim 1, wherein said buffer layer contains titanium and nitrogen.

* * * * *